United States Patent
Radulescu et al.

(10) Patent No.: US 8,969,927 B2
(45) Date of Patent: Mar. 3, 2015

(54) GATE CONTACT FOR A SEMICONDUCTOR DEVICE AND METHODS OF FABRICATION THEREOF

(71) Applicant: Cree, Inc., Durham, NC (US)

(72) Inventors: Fabian Radulescu, Chapel Hill, NC (US); Helmut Hagleitner, Zebulon, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/799,216

(22) Filed: Mar. 13, 2013

(65) Prior Publication Data

US 2014/0264713 A1    Sep. 18, 2014

(51) Int. Cl.
| | | |
|---|---|---|
| H01L 29/80 | (2006.01) | |
| H01L 31/112 | (2006.01) | |
| H01L 29/68 | (2006.01) | |
| H01L 21/28 | (2006.01) | |

(52) U.S. Cl.
CPC ............. *H01L 29/68* (2013.01); *H01L 21/28* (2013.01)
USPC ............ 257/284; 257/471; 257/192; 257/194

(58) Field of Classification Search
USPC .................................. 257/192, 194, 284, 471
See application file for complete search history.

(56) References Cited

U.S. PATENT DOCUMENTS

| | | | |
|---|---|---|---|
| 6,316,793 B1 | 11/2001 | Sheppard et al. | |
| 6,407,002 B1 | 6/2002 | Lin et al. | |
| 6,475,836 B1 | 11/2002 | Suzawa et al. | |
| 6,740,599 B2 | 5/2004 | Yamazaki et al. | |
| 7,550,783 B2 | 6/2009 | Wu et al. | |
| 7,960,756 B2 | 6/2011 | Sheppard et al. | |
| 8,114,717 B2 * | 2/2012 | Palacios et al. | 438/142 |
| 8,283,699 B2 | 10/2012 | Wu | |
| 8,357,571 B2 | 1/2013 | Radulescu et al. | |
| 2002/0197846 A1 | 12/2002 | Suzawa et al. | |
| 2004/0144991 A1 | 7/2004 | Kikkawa | |
| 2007/0018199 A1 | 1/2007 | Sheppard et al. | |
| 2007/0018210 A1 | 1/2007 | Sheppard | |

(Continued)

FOREIGN PATENT DOCUMENTS

WO    2012047342 A2    4/2012

OTHER PUBLICATIONS

Ping, Andrew T. et al., "A High-Performance 0.13-μm AlGaAs/InGaAs pHEMT Process Using Sidewall Spacer Technology," 2005 CS MANTECH, 2005, 4 pages.

(Continued)

*Primary Examiner* — Thien F Tran
(74) *Attorney, Agent, or Firm* — Withrow & Terranova, P.L.L.C.

(57) ABSTRACT

Embodiments of a gate contact for a semiconductor device and methods of fabrication thereof are disclosed. In one embodiment, a semiconductor device includes a semiconductor structure and a dielectric layer on a surface of the semiconductor structure, where the dielectric layer has an opening that exposes an area of the semiconductor structure. A gate contact for the semiconductor device is formed on the exposed area of the semiconductor structure through the opening in the dielectric layer. The gate contact includes a proximal end on a portion of the exposed area of the semiconductor structure, a distal end opposite the proximal end, and sidewalls that each extend between the proximal end and the distal end of the gate contact. For each sidewall of the gate contact, an air region separates the sidewall and the distal end of the gate contact from the dielectric layer.

27 Claims, 20 Drawing Sheets

(56) References Cited

U.S. PATENT DOCUMENTS

| | | | |
|---|---|---|---|
| 2007/0164321 A1* | 7/2007 | Sheppard et al. | 257/256 |
| 2008/0157121 A1 | 7/2008 | Ohki | |
| 2009/0189187 A1 | 7/2009 | Briere et al. | |
| 2010/0025730 A1 | 2/2010 | Heikman et al. | |
| 2010/0171150 A1 | 7/2010 | Smith et al. | |
| 2012/0049243 A1* | 3/2012 | Wu | 257/194 |

OTHER PUBLICATIONS

Nevers, Corey et al., "High-Volume 0.25 µm AlGaAs/InGaAs E/D pHEMT Process Utilizing Optical Lithography," CS MANTECH Conference, May 18-21, 2009, 4 pages, Tampa, Florida.

Sheppard, Scott et al., "High-Efficiency Amplifiers Using AlGaN/GaN HEMTs on SiC," CS MANTECH Conference, Apr. 24-27, 2006, pp. 175-178, Vancouver, British Columbia.

International Search Report for International Patent Application No. PCT/US11/42933, mailed Feb. 14, 2013, 6 pages.

Non-Final Office Action for U.S. Appl. No. 12/879,398, mailed Jun. 21, 2012, 12 pages.

Notice of Allowance for U.S. Appl. No. 12/879,398, mailed Oct. 24, 2012, 8 pages.

* cited by examiner

US 8,969,927 B2

GATE CONTACT FOR A SEMICONDUCTOR DEVICE AND METHODS OF FABRICATION THEREOF

GOVERNMENT SUPPORT

This invention was made with government funds under contract number 11-D-5309 awarded by the Department of Defense. The U.S. Government may have rights in this invention.

FIELD OF THE DISCLOSURE

The present disclosure relates to a gate contact for a semiconductor device.

BACKGROUND

Schottky barrier semiconductor devices are widely used in many electronic applications ranging from high frequency or microwave frequency applications to high power applications. Schottky barrier semiconductor devices include, for example, Schottky diodes, High Electron Mobility Transistors (HEMTs), and Metal Semiconductor Field Effect Transistors (MESFETs). In each type of Schottky barrier semiconductor device, there is a Schottky gate contact that forms a Schottky barrier to an underlying semiconductor structure. A Schottky barrier is a potential barrier formed at a metal-semiconductor junction. The length of the Schottky gate contact (i.e., a gate length of the Schottky barrier semiconductor device) is a critical dimension of Schottky barrier semiconductor device. The length of the Schottky gate contact directly impacts a frequency response (i.e., the frequency of operation) of the Schottky barrier semiconductor device as well as other operational parameters of the Schottky barrier semiconductor device such as, for instance, transconductance.

It is particularly desirable for high frequency applications to minimize the length of the Schottky gate contact and thus the gate length of the Schottky barrier semiconductor device. Conventional processes for forming Schottky gate contacts consist of photoresist patterning followed by an etch of a dielectric down to the surface of an underlying semiconductor structure. The Schottky gate contact is then formed in the opening in the dielectric such that the length of the Schottky gate contact, and thus the gate length of the Schottky barrier semiconductor device, is defined by the length of the opening in the dielectric. However, an optical step size of a conventional optical stepper used for patterning the photoresist is limited to 0.4 micrometers. As a result, the minimum gate length achievable using conventional processing is 0.4 micrometers. Thus, there is a need for a Schottky gate contact that provides a reduced gate length and methods of fabrication thereof.

SUMMARY

Embodiments of a gate contact for a semiconductor device and methods of fabrication thereof are disclosed. In one embodiment, a semiconductor device includes a semiconductor structure and a dielectric layer on a surface of the semiconductor structure, where the dielectric layer has an opening that exposes an area of the semiconductor structure. A gate contact for the semiconductor device is formed on the exposed area of the semiconductor structure through the opening in the dielectric layer. The gate contact includes a proximal end on a portion of the exposed area of the semiconductor structure, a distal end opposite the proximal end, and sidewalls that each extend between the proximal end and the distal end of the gate contact. For each sidewall of the gate contact, an air region separates the sidewall and the distal end of the gate contact from the dielectric layer. The air regions minimize a parasitic capacitance between the gate contact and the semiconductor structure through the dielectric layer.

In one embodiment, the gate contact is directly on the portion of the exposed area of the semiconductor structure such that the gate contact is a Schottky gate contact. Further, in one embodiment, a length of the proximal end of the gate contact, and thus a gate length of the gate contact, is less than or equal to 0.15 micrometers or more preferably less than or equal to 0.1 micrometers. In another embodiment, the length of the proximal end of the gate contact, and thus a gate length of the gate contact, is in a range of and including 0.05 to 0.25 micrometers. In another embodiment, the length of the proximal end of the gate contact, and thus a gate length of the gate contact, is in a range of and including 0.05 to 0.15 micrometers. In another embodiment, the length of the proximal end of the gate contact, and thus a gate length of the gate contact, is in a range of and including 0.05 to 0.1 micrometers. As a result of the small gate length, a frequency response of the semiconductor device is substantially improved as compared to that of conventional semiconductor devices having gate lengths greater than or equal to 0.4 micrometers.

In another embodiment, a semiconductor device includes a semiconductor structure and a gate contact on the semiconductor structure having a gate length of less than or equal to 0.15 micrometers or more preferably less than or equal to 0.1 micrometers.

In one embodiment, a method of fabricating a semiconductor device includes providing a semiconductor structure, providing a first dielectric layer on the semiconductor structure, providing a second dielectric layer on the first dielectric layer opposite the semiconductor structure, and forming a first opening in the first and second dielectric layers to expose an area of the semiconductor structure. Spacers are then formed adjacent to sidewalls of the first opening in the first and second dielectric layers such that the spacers define a second opening between the spacers that has a length that is substantially less than a length of the first opening. A gate contact is then provided within the second opening such that a proximal end of the gate contact is on a portion of the exposed area of the semiconductor structure that is exposed by the second opening. The spacers and the second dielectric layer are then removed such that, for each sidewall of the gate contact, an air region separates the sidewall and a distal end of the gate contact from the first dielectric layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
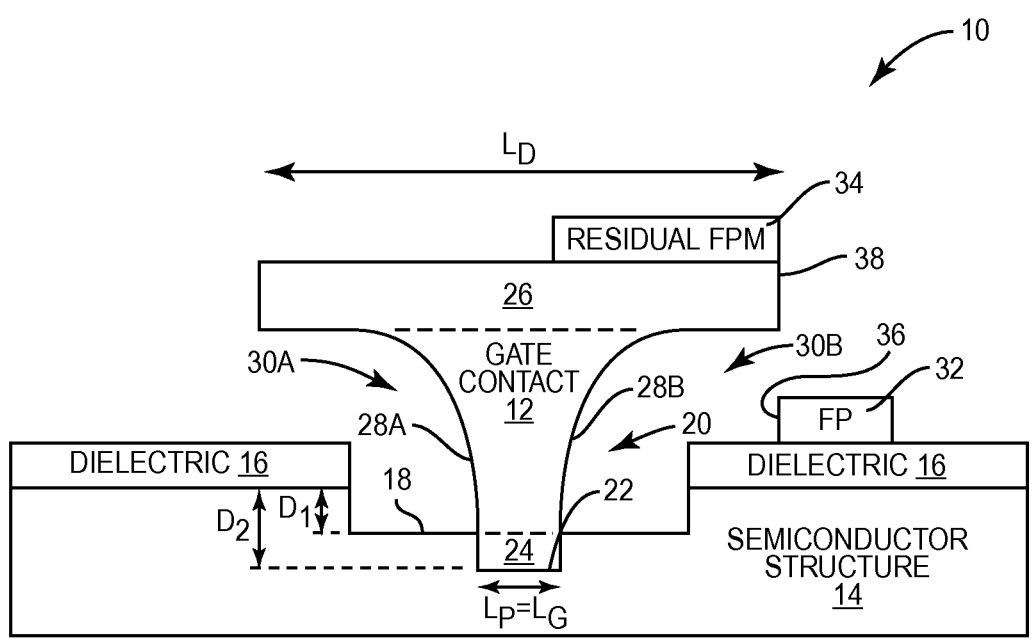
FIG. 1 illustrates a semiconductor device including a gate contact according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of a gate contact for semiconductor devices and methods of fabrication thereof are disclosed. Preferably, the gate contact is a Schottky gate contact. In this regard, FIG. 1 illustrates a semiconductor device 10 including a gate contact 12 according to one embodiment of the present disclosure. The semiconductor device 10 is preferably a Schottky barrier semiconductor device such as, for example, a Schottky diode, a High Electron Mobility Transistor (HEMT), or a Metal Semiconductor Field Effect Transistor (MESFET), but is not limited thereto. It should be noted that while FIG. 1, as well as the figures below, only illustrate the gate contact 12, the semiconductor device 10 includes additional contacts (e.g., a source contact and a drain contact in an implementation where the semiconductor device 10 is a HEMT or a MESFET) that are not shown in the figures.

As illustrated, the semiconductor device 10 includes a semiconductor structure 14. The semiconductor structure 14 generally includes one or more layers of the same or different semiconductor materials. For example, in one embodiment, the semiconductor device 10 is a HEMT, and the semiconductor structure 14 includes at least two semiconductor layers of different semiconductor materials. More specifically, for a Gallium Nitride (GaN) based HEMT, the semiconductor structure 14 may include a GaN base layer and an Aluminum Gallium Nitride (AlGaN) barrier layer on the GaN base layer such that a 2-Dimensional Electron Gas (2DEG) channel is formed at the interface between the GaN base layer and the AlGaN barrier layer. In addition, the semiconductor structure 14 may include a growth substrate such as, for example, a Silicon Carbide (SiC) growth substrate, a sapphire substrate, a Silicon (Si) substrate, or the like. The examples given above for the semiconductor structure 14 are only examples. The particular make-up of the semiconductor structure 14 depends on the type of semiconductor device 10 and the particular implementation of that type of semiconductor device 10.

The semiconductor device 10 also includes a dielectric layer 16 on, and preferably directly on, a surface of the semiconductor structure 14. The dielectric layer 16 is formed of a desired dielectric, or insulator, material. In this embodiment, the semiconductor structure 14 includes an outer recess 18 that is aligned with an opening 20 in the dielectric layer 16 and an inner recess 22 that is within the outer recess 18. In one embodiment, a length of the opening 20 in the dielectric layer 16, and thus a length of the outer recess 18, is greater than or equal to 0.4 micrometers. The outer recess 18 extends from the surface of the semiconductor structure 14 to a first depth ($D_1$) in the semiconductor structure 14, and the inner recess 22 extends from a bottom of the outer recess 18 to a second depth ($D_2$) in the semiconductor structure 14, where $D_2 > D_1$.

The gate contact 12 includes a proximal end 24 that is on, and preferably directly on, a portion of the semiconductor structure 14 that is within the inner recess 22, a distal end 26, and sidewalls 28A and 28B that extend between the proximal end 24 and the distal end 26. A length ($L_P$) of the proximal end 24 of the gate contact 12 is substantially less than a length ($L_D$) of the distal end 26 of the gate contact 12. As such, the gate contact 12 is referred to herein as having a T-structure. The length ($L_P$) of the proximal end 24 of the gate contact 12 defines a gate length ($L_G$) of the semiconductor device 10. As discussed below, the length ($L_P$) of the proximal end 24, and thus the gate length ($L_G$) of the semiconductor device 10, is substantially less than that which is achievable using conventional processing. More specifically, in one embodiment, the length ($L_P$) of the proximal end 24, and thus the gate length ($L_G$) of the semiconductor device 10, is in a range of and including 0.05 to 0.25 micrometers and more preferably in a range of and including 0.05 to 1.5 micrometers, and even more preferably in a range of and including 0.05 to 1 micrometers. In one preferred embodiment, the length ($L_P$) of the proximal end 24, and thus the gate length ($L_G$) of the semiconductor device 10, is less than or equal to 0.15 micrometers and more preferably less than or equal to 0.1 micrometers. As a result of the small gate length ($L_G$), a frequency response of the semiconductor device 10 is substantially improved as compared to the same semiconductor device 10 having a conventional gate contact. In one embodiment, the length ($L_D$) of the distal end 26 of the gate contact 12 is greater than or equal to 0.4 micrometers.

The sidewalls 28A and 28B and the distal end 26 of the gate contact 12 are separated from the semiconductor structure 14 and the dielectric layer 16 by corresponding air regions 30A and 30B. The air regions 30A and 30B are also referred to herein as voids. As discussed below, in the preferred embodiments described herein, the air regions 30A and 30B correspond to voids created by removing a sacrificial dielectric layer and spacers after forming the gate contact 12. The air regions 30A and 30B minimize or eliminate a parasitic capacitance between the gate contact 12 and the semiconductor structure 14 that would otherwise be present if a dielectric material were in the air regions 30A and 30B.

Lastly, the semiconductor device 10 includes a field plate (FP) 32 and a residual field plate metal (FPM) 34. Note that both the field plate 32 and the residual field plate metal 34 are optional. As illustrated, an inner edge 36 of the field plate 32 is aligned with a corresponding outer edge 38 of the distal end 26 of the gate contact 12. As discussed below in detail, in the preferred embodiments described herein, the field plate 32 and the residual field plate metal 34 are formed by first blanket depositing a photoresist layer over the semiconductor device 10 and then patterning the photoresist layer to form an opening that is over a portion of the gate contact 12 and laterally extends over the outer edge 38 of the distal end 26 of the gate contact 12 and continues laterally over a desired location for the field plate 32. A field plate metal is then deposited over the patterned photo resist layer and within the opening in the patterned photoresist layer. The photoresist layer is then removed, thereby leaving the field plate 32 and the residual field plate metal 34. The air region 30B separates the field plate 32 from the gate contact 12 and the residual field plate metal 34. In effect, the residual field plate metal 34 becomes part of the gate contact 12. The field plate 32 may be desirable, for example, for high power lateral transistors where a high electric field is present between the gate contact 12 and a drain contact (not shown), which would be to the right of the gate contact 12 in this example. The field plate 32 is grounded by connecting to a source contact (not shown), which would be to the left of the gate contact 12 in this example. This structure would thereby lower the peak electric field present at the drain side of the gate contact 12.

The air regions 30A and 30B provide multiple advantages. First, the air regions 30A and 30B minimize or eliminate a parasitic capacitance between the semiconductor structure 14 and the sidewalls 28A and 28B and the distal end 26 of the gate contact 12. In addition, the air region 30B enables the field plate 32 to be self-aligned. In other words, the air region 30B significantly reduces alignment requirements for the field plate 32. Rather than requiring very accurate and precise alignment to position the field plate 32 on the dielectric layer 16 adjacent to the gate contact 12, the field plate 32 is formed by depositing a desired field plate metal over a more general area that starts on the gate contact 12 and extends laterally over the dielectric layer 16 toward the drain contact (not shown). During deposition of the field plate metal, the air region 30B naturally creates a break in the field plate metal such that the inner edge 36 of the field plate 32 is aligned with the outer edge 38 of the distal end 26 of the gate contact 12. As such, the field plate 32 is also referred to herein as a self-aligned field plate. Because the field plate 32 is self-aligned, the field plate 32 can be formed directly on the dielectric layer 16 at the outer edge 38 of the distal end 26 of the gate contact 12. This is a substantial improvement over the traditional field plate. For the traditional field plate, an additional dielectric layer would be formed over the dielectric layer 16 and the gate contact 12, and the traditional field plate would then be formed on the additional dielectric layer near the outer edge 38 of the distal end 26 of the gate contact 12. As a result, the traditional field plate would be relatively far away from the semiconductor structure 14, which in turn reduces an effectiveness of the traditional field plate as compared to the field plate 32.

Figure 2A:
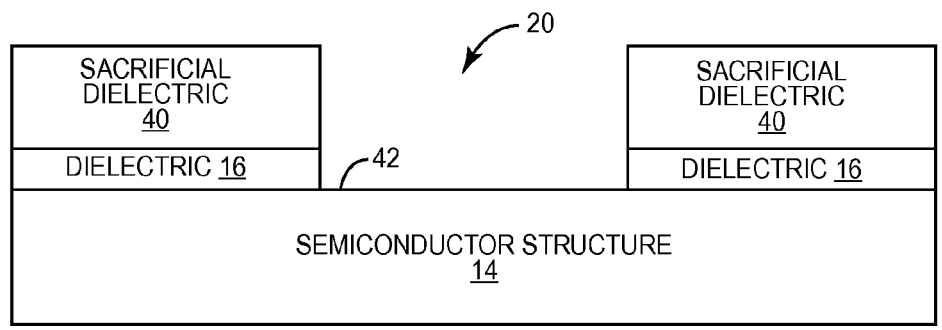
FIGS. 2A through 2I illustrate a process for fabricating the semiconductor device of FIG. 1 according to one embodiment of the present disclosure.

FIGS. 2A through 2I illustrate a method of fabricating the semiconductor device 10, and in particular the gate contact 12, of FIG. 1 according to one embodiment of the present disclosure. First, as illustrated in FIG. 2A, the dielectric layer 16 is provided on the semiconductor structure 14, and a sacrificial dielectric layer 40 is formed on the dielectric layer 16 opposite the semiconductor structure 14. The dielectric layer 16 and the sacrificial dielectric layer 40 are formed such that they can be selectively etched. More specifically, in one embodiment, the dielectric layer 16 and the sacrificial dielectric layer 40 are formed of different dielectric materials that enable selective etching of the sacrificial dielectric layer 40. For example, in one particular embodiment, the dielectric layer 16 is one or more nitride layers, and the sacrificial dielectric layer 40 is one or more oxide layers. The opening 20 is formed in the dielectric layer 16 and the sacrificial dielectric layer 40 to thereby expose an area of the semiconductor structure 14, which is referred to herein as an exposed area 42 of the semiconductor structure 14.

Figure 2B:
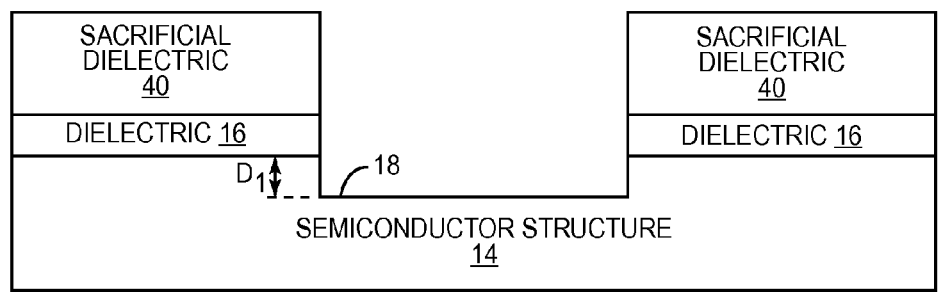
Figure 2C:
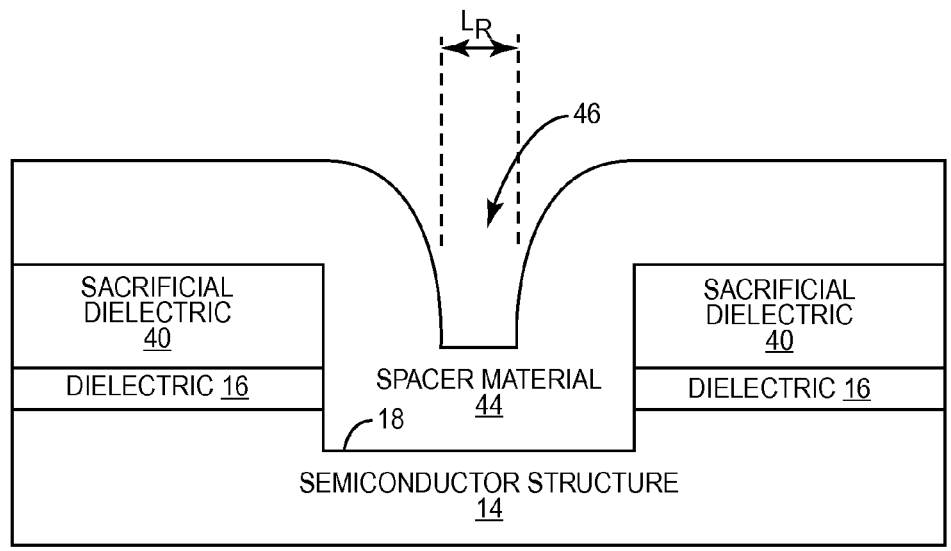

Next, using the dielectric layer 16 and the sacrificial dielectric layer 40 as a mask, the exposed area 42 of the semiconductor structure 14 is etched to the first depth ($D_1$) to form the outer recess 18 that is aligned with the opening 20 in the dielectric layer 16 and the sacrificial dielectric layer 40, as illustrated in FIG. 2B. After the outer recess 18 is formed, a spacer material layer 44 is formed over the sacrificial dielectric layer 40 and within the outer recess 18 as illustrated in FIG. 2C. The spacer material layer 44 is preferably formed of a material that is either the same as the material used for the sacrificial dielectric layer 40 or is at least similar to the material used for the sacrificial dielectric layer 40. As a result of the outer recess 18, a recess 46 naturally forms in the spacer material layer 44 over the outer recess 18. As a thickness of the spacer material layer 44 increases, a length ($L_R$) of the recess 46 decreases. The length ($L_R$) of the recess 46 corresponds to the length ($L_P$) of the proximal end 24 of the gate contact 12 and thus the gate length ($L_G$) of the semiconductor device 10. As such, the spacer material layer 44 can be grown in such a manner as to achieve any desired gate length ($L_G$).

Figure 2D:
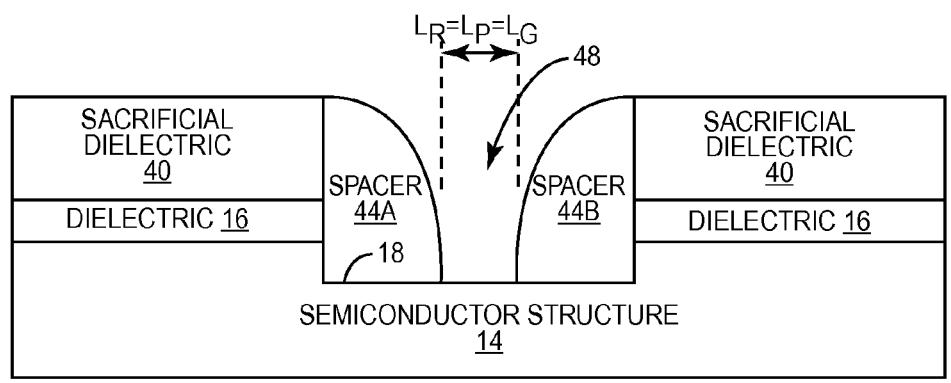

Next, the spacer material layer 44 is anisotropically etched in a direction that is perpendicular to the semiconductor structure 14 to form spacers 44A and 44B that are adjacent to corresponding sidewalls of the outer recess 18, as illustrated in FIG. 2D. The spacers 44A and 44B extend vertically along corresponding sidewalls of the dielectric layer 16 and the sacrificial dielectric layer 40. The anisotropic etch of the spacer material layer 44 exposes a portion of the semiconductor structure 14 within an opening 48 between the spacers 44A and 44B. A length of the opening 48 corresponds to the length ($L_R$) of the recess 46 in the spacer material layer 44 (FIG. 2C), which in turn corresponds to the length ($L_P$) of the proximal end 24 of the gate contact 12 and thus the gate length ($L_G$) of the semiconductor device 10.

Figure 2E:
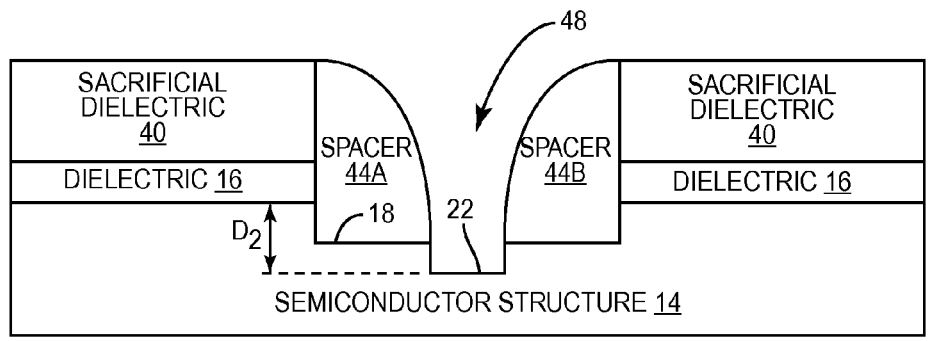
Figure 2F:
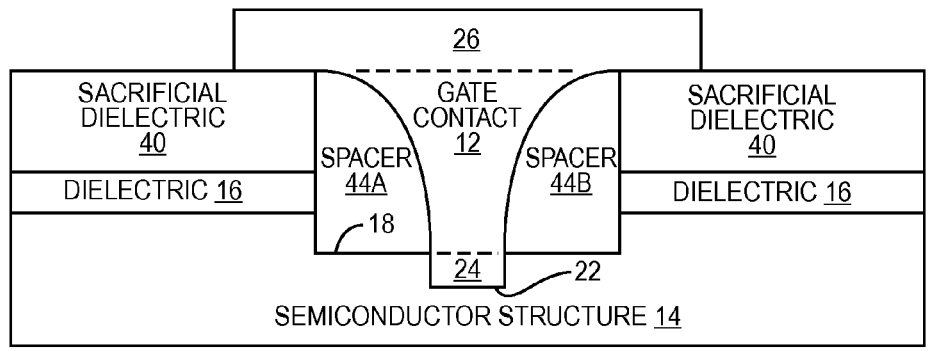

As illustrated in FIG. 2E, the semiconductor structure 14 is then etched to the second depth ($D_2$) using the sacrificial dielectric layer 40 and the spacers 44A and 44B as a mask to thereby create the inner recess 22 that is aligned with the opening 48 between the spacers 44A and 44B. The inner recess 22 is referred to herein as a self-aligned recess in that, by using the spacers 44A and 44B as the mask, the inner recess 22 is naturally aligned over a desired portion of the semiconductor structure 14 for the gate contact 12 without the use of any additional alignment technique. Further, as a result of the spacers 44A and 44B, the inner recess 22 is laterally spaced apart from the sidewalls of the outer recess 18. In other words, the inner recess 22 is created within a portion of the outer recess 18 as defined by the spacers 44A and 44B. After forming the inner recess 22, the gate contact 12 is formed within the opening 48 between the spacers 44A and 44B and within the inner recess 22 as illustrated in FIG. 2F. As a result, the proximal end 24 of the gate contact 12 is formed on, and preferably directly on, the semiconductor structure 14 within the inner recess 22. The gate contact 12 fills the opening between the spacers 44A and 44B and, in this example, extends laterally over a portion of the sacrificial dielectric layer 40. As such, the gate contact 12 is a T-shaped structure.

Figure 2G:
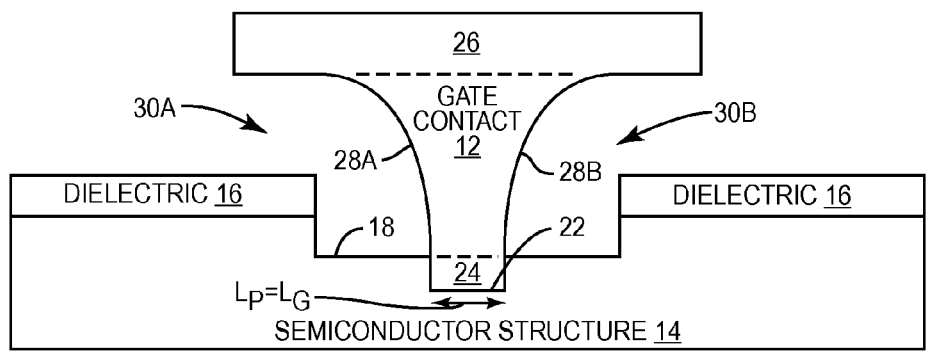
Figure 2H:
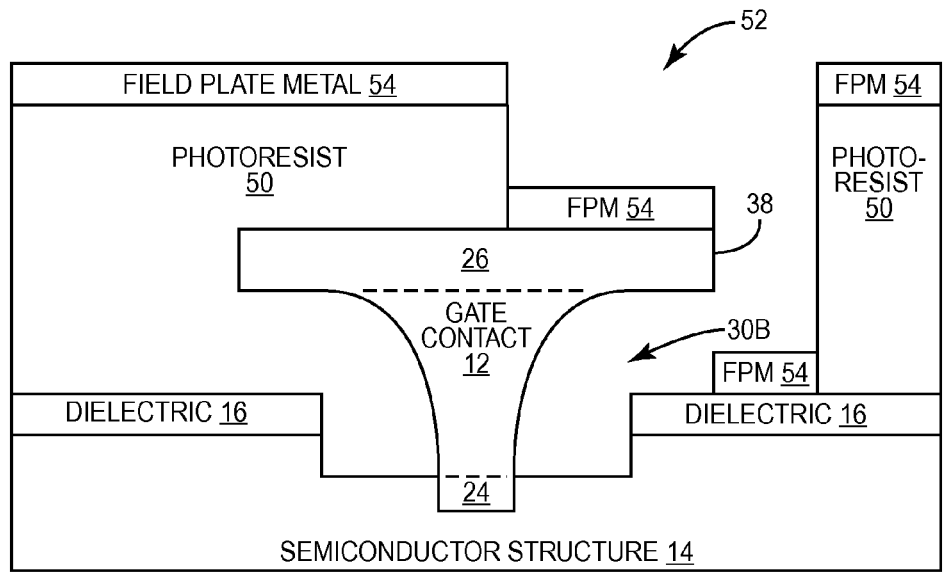
Figure 2I:
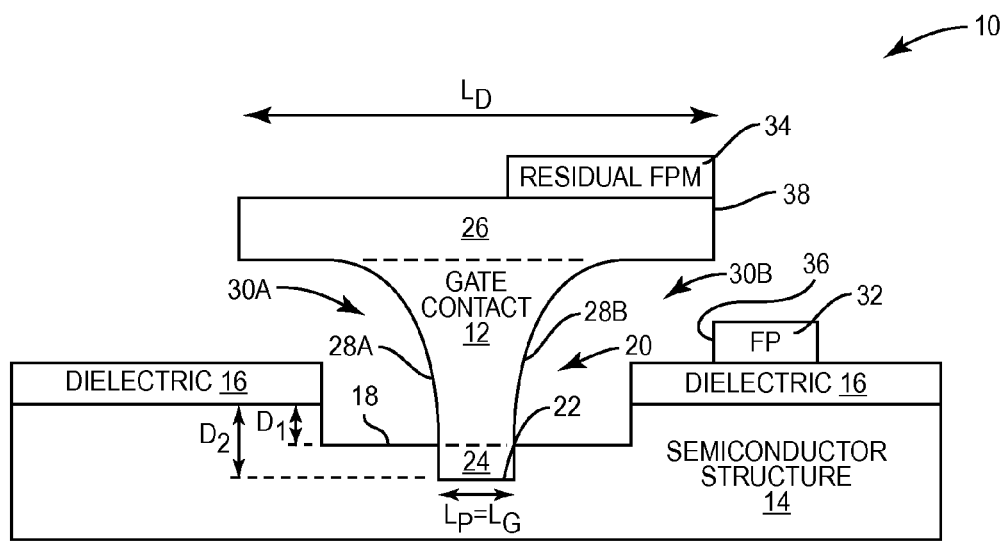

As illustrated in FIG. 2G, after the gate contact 12 is formed, the sacrificial dielectric layer 40 and the spacers 44A and 44B are removed using a selective etch to thereby form the air regions 30A and 30B. Since the sacrificial dielectric layer 40 and the spacers 44A and 44B are preferably formed of the same or similar dielectric material(s), a single etch may be used to remove both the sacrificial dielectric layer 40 and the spacers 44A and 44B. Next, as illustrated in FIG. 2H, a photoresist layer 50 is blanket deposited and patterned to form an opening 52. A field plate metal 54 is then deposited over the photoresist layer 50 and within the opening 52. Note that, as a result of the air region 30B, there is a natural break in the field plate metal 54 at the outer edge 38 of the distal end 26 of the gate contact 12. Lastly, the photoresist layer 50 is removed to provide the field plate 32 and the residual field plate metal 34 as illustrated in FIG. 2I.

Figure 3:
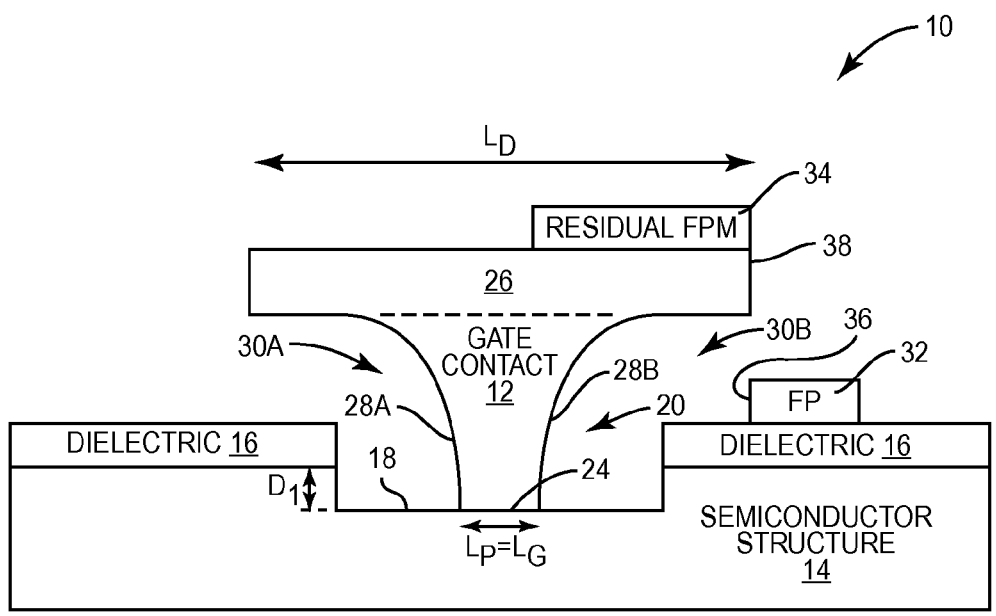
FIG. 3 illustrates a semiconductor device including a gate contact according to another embodiment of the present disclosure.

FIG. 3 illustrates the semiconductor device 10 according to another embodiment of the present disclosure. The semiconductor device 10 of FIG. 3 is substantially the same as that of FIG. 1. However, in this embodiment, there is only a single recess in the semiconductor structure 14, namely the outer recess 18, and the proximal end 24 of the gate contact 12 is on, and preferably directly on, the semiconductor structure 14 rather than in the inner recess 22 (FIG. 1).

Figure 4A:
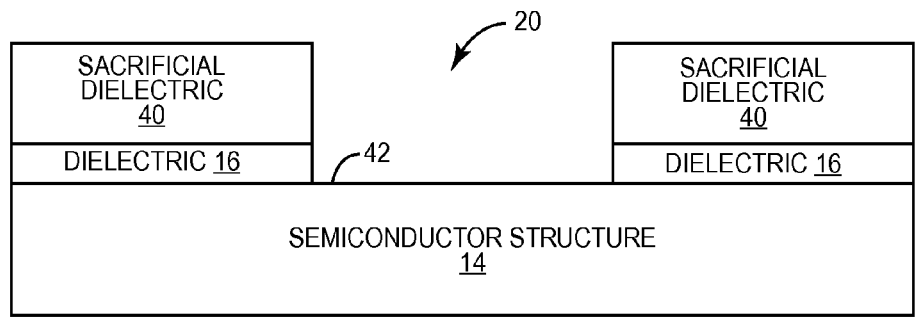
FIGS. 4A through 4H illustrate a process for fabricating the semiconductor device of FIG. 3 according to one embodiment of the present disclosure.

FIGS. 4A through 4H illustrate a method for fabricating the semiconductor device 10 of FIG. 3. This process is substantially the same as that of FIGS. 2A through 2I without the etching of the inner recess 22 illustrated in FIG. 2E. First, as illustrated in FIG. 4A, the dielectric layer 16 is provided on the semiconductor structure 14, and the sacrificial dielectric layer 40 is formed on the dielectric layer 16 opposite the semiconductor structure 14. The dielectric layer 16 and the sacrificial dielectric layer 40 are formed such that they can be selectively etched. More specifically, in one embodiment, the dielectric layer 16 and the sacrificial dielectric layer 40 are formed of different dielectric materials that enable selective etching of the sacrificial dielectric layer 40. For example, in one particular embodiment, the dielectric layer 16 is one or more nitride layers, and the sacrificial dielectric layer 40 is one or more oxide layers. The opening 20 is formed in the dielectric layer 16 and the sacrificial dielectric layer 40 to thereby expose an area of the semiconductor structure 14, which is referred to herein as the exposed area 42 of the semiconductor structure 14.

Figure 4B:
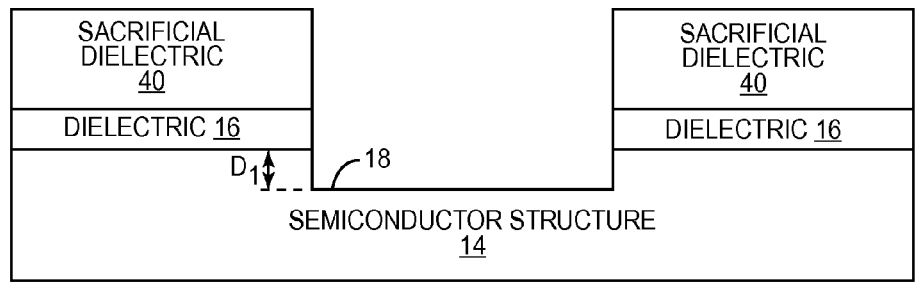
Figure 4C:
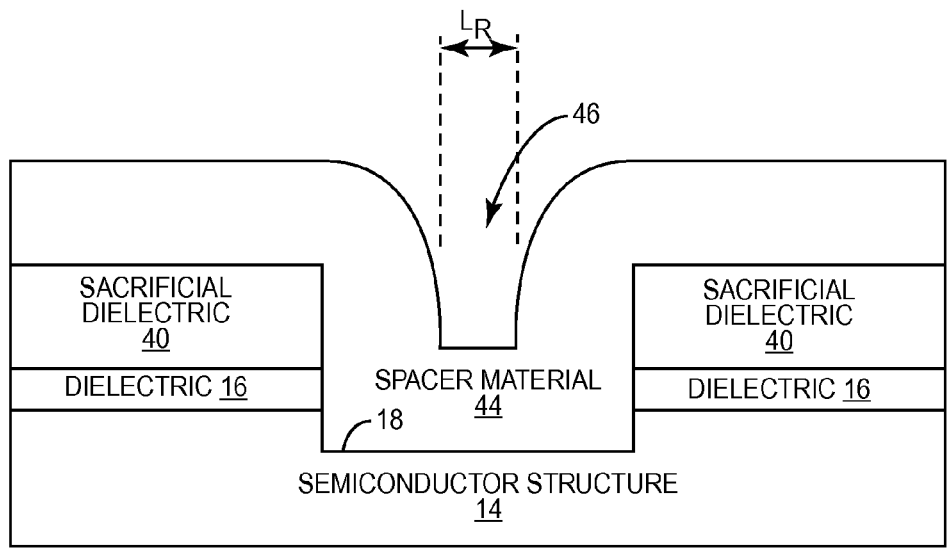

Next, using the dielectric layer 16 and the sacrificial dielectric layer 40 as a mask, the exposed area 42 of the semiconductor structure 14 is etched to the first depth ($D_1$) to form the outer recess 18 that is aligned with the opening 20 in the dielectric layer 16 and the sacrificial dielectric layer 40, as illustrated in FIG. 4B. After the outer recess 18 is formed, the spacer material layer 44 is formed over the sacrificial dielectric layer 40 and within the outer recess 18 as illustrated in FIG. 4C. The spacer material layer 44 is preferably formed of a material that is either the same as the material used for the sacrificial dielectric layer 40 or is at least similar to the material used for the sacrificial dielectric layer 40. As a result of the outer recess 18, the recess 46 naturally forms in the spacer material layer 44 over the outer recess 18. As the thickness of the spacer material layer 44 increases, the length ($L_R$) of the recess 46 decreases. The length ($L_R$) of the recess 46 corresponds to the length ($L_P$) of the proximal end 24 of the gate contact 12 and thus the gate length ($L_G$) of the semiconductor device 10. As such, the spacer material layer 44 can be grown in such a manner as to achieve any desired gate length ($L_G$).

Figure 4D:
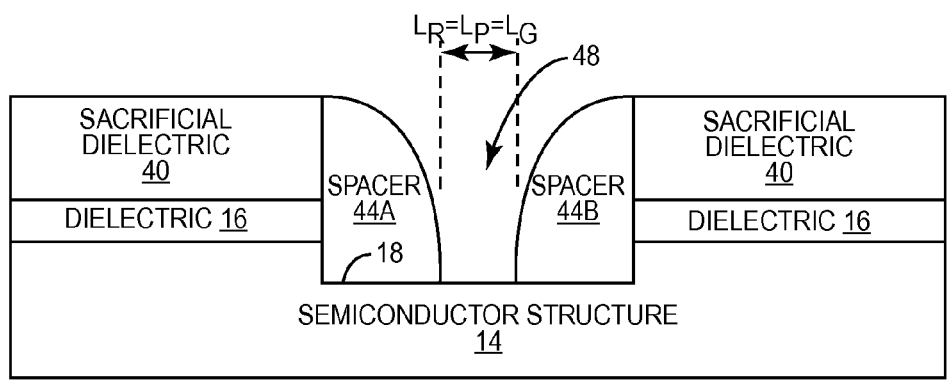

Next, the spacer material layer 44 is anisotropically etched in a direction that is perpendicular to the semiconductor structure 14 to form the spacers 44A and 44B that are adjacent to corresponding sidewalls of the outer recess 18, as illustrated in FIG. 4D. The spacers 44A and 44B extend vertically along corresponding sidewalls of the dielectric layer 16 and the sacrificial dielectric layer 40. The anisotropic etch of the spacer material layer 44 exposes the portion of the semiconductor structure 14 within the opening 48 between the spacers 44A and 44B. The length of the opening 48 corresponds to the length ($L_R$) of the recess 46 in the spacer material layer 44 (FIG. 4C), which in turn corresponds to the length ($L_P$) of the proximal end 24 of the gate contact 12 and thus the gate length ($L_G$) of the semiconductor device 10.

Figure 4E:
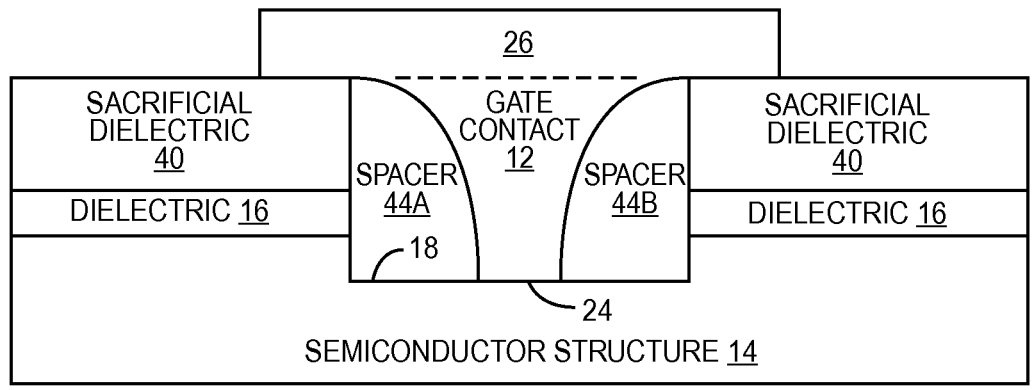

After forming the spacers 44A and 44B, the gate contact 12 is formed within the opening 48 between the spacers 44A and 44B as illustrated in FIG. 4E. As a result, the proximal end 24 of the gate contact 12 is formed on, and preferably directly on, the portion of the semiconductor structure 14 exposed by the opening 48 between the spacers 44A and 44B. The gate contact 12 fills the opening between the spacers 44A and 44B and, in this example, extends laterally over a portion of the sacrificial dielectric layer 40. As such, the gate contact 12 is a T-shaped structure.

Figure 4F:
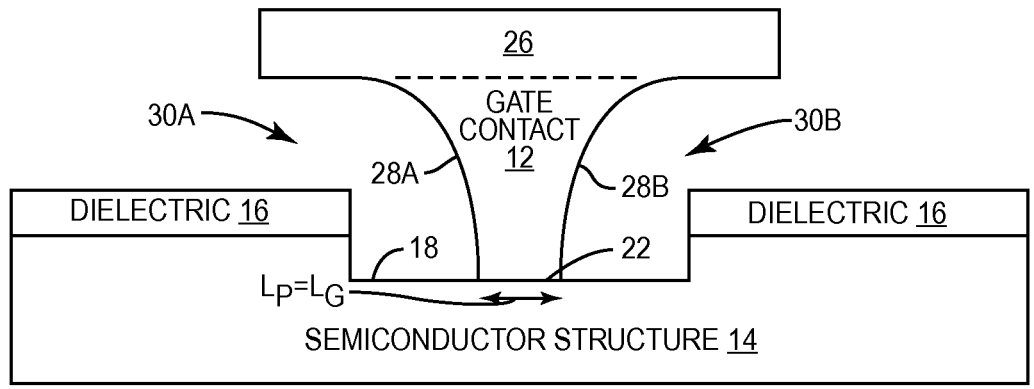
Figure 4G:
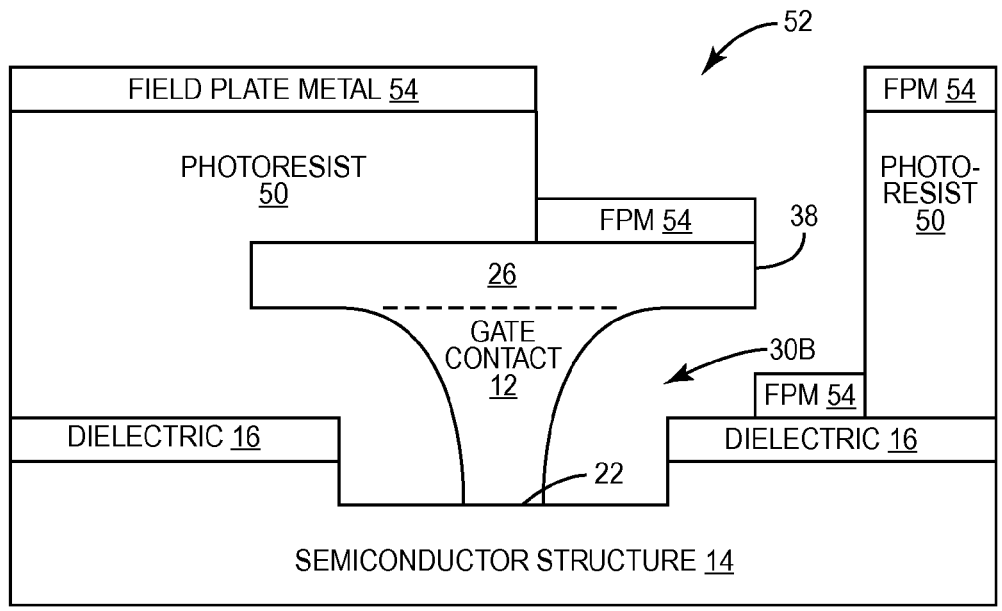
Figure 4H:
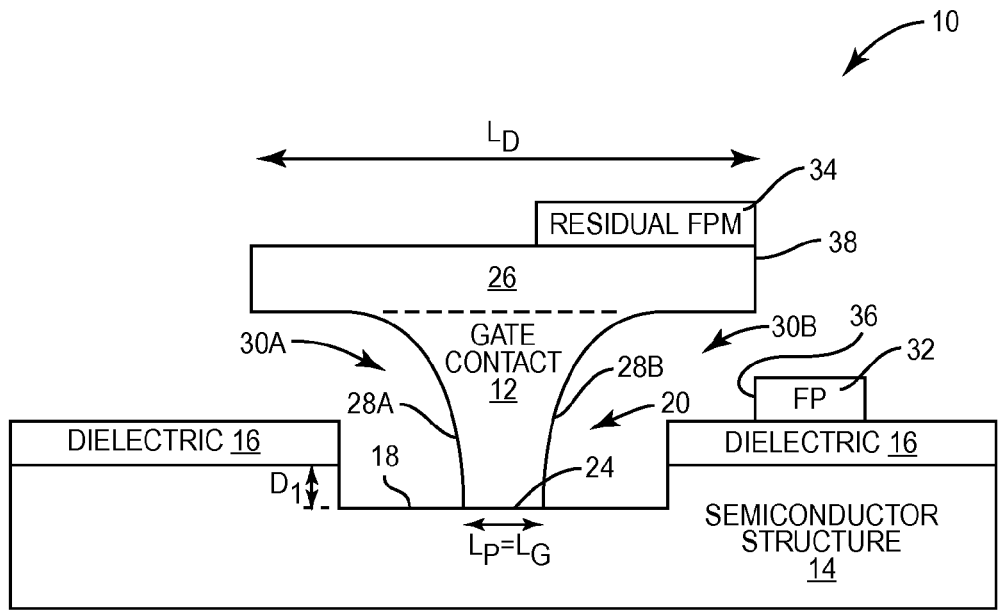

As illustrated in FIG. 4F, after the gate contact 12 is formed, the sacrificial dielectric layer 40 and the spacers 44A and 44B are removed using a selective etch to thereby form the air regions 30A and 30B. Since the sacrificial dielectric layer 40 and the spacers 44A and 44B are preferably formed of the same or similar dielectric material(s), a single etch may be used to remove both the sacrificial dielectric layer 40 and the spacers 44A and 44B. Next, as illustrated in FIG. 4G, the photoresist layer 50 is blanket deposited and patterned to form the opening 52. The field plate metal 54 is then deposited over the photoresist layer 50 and within the opening 52. Note that, as a result of the air region 30B, there is a natural break in the field plate metal 54 at the outer edge 38 of the distal end 26 of the gate contact 12. Lastly, the photoresist layer 50 is removed to provide the field plate 32 and the residual field plate metal 34 as illustrated in FIG. 4H.

Figure 5:
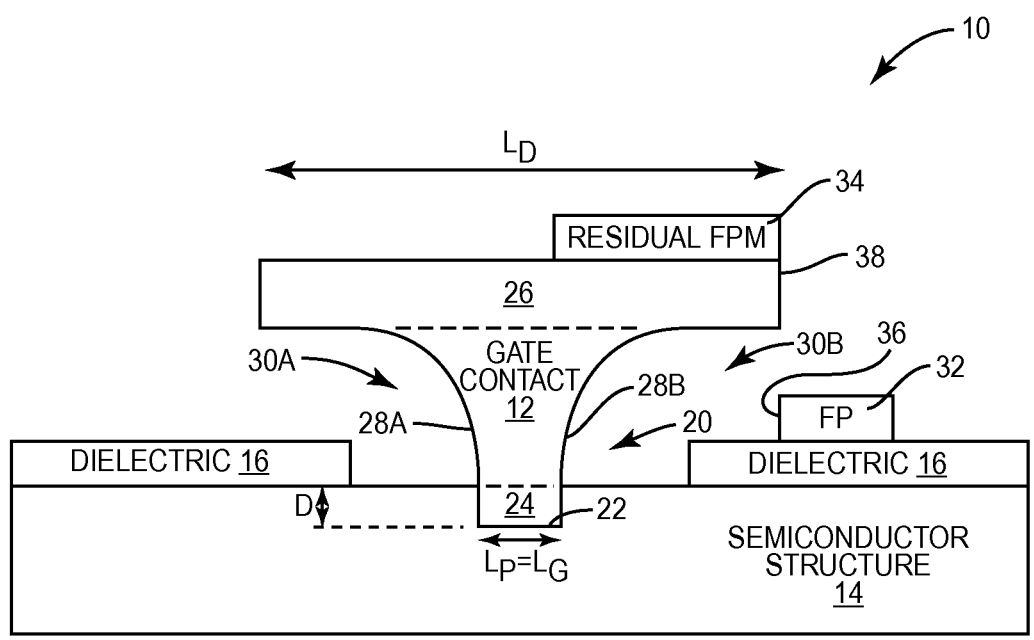
FIG. 5 illustrates a semiconductor device including a gate contact according to another embodiment of the present disclosure.

FIG. 5 illustrates the semiconductor device 10 according to another embodiment of the present disclosure. The semiconductor device 10 of FIG. 5 is substantially the same as that of FIG. 1. However, in this embodiment, there is only a single recess in the semiconductor structure 14, namely the inner recess 22. Like in the embodiment of FIG. 1, the proximal end 24 of the gate contact 12 is on, and preferably directly on, the portion of the semiconductor structure 14 within the inner recess 22.

Figure 6A:
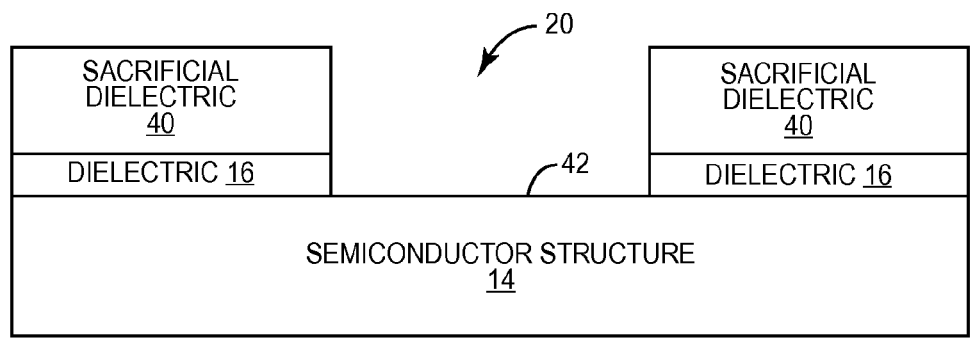
FIGS. 6A through 6H illustrate a process for fabricating the semiconductor device of FIG. 5 according to one embodiment of the present disclosure.

FIGS. 6A through 6H illustrate a method for fabricating the semiconductor device 10 of FIG. 5. This process is substantially the same as that of FIGS. 2A through 2I without the etching of the outer recess 18 illustrated in FIG. 2B. First, as illustrated in FIG. 6A, the dielectric layer 16 is provided on the semiconductor structure 14, and the sacrificial dielectric layer 40 is formed on the dielectric layer 16 opposite the semiconductor structure 14. The dielectric layer 16 and the sacrificial dielectric layer 40 are formed such that they can be selectively etched. More specifically, in one embodiment, the dielectric layer 16 and the sacrificial dielectric layer 40 are formed of different dielectric materials that enable selective etching of the sacrificial dielectric layer 40. For example, in one particular embodiment, the dielectric layer 16 is one or more nitride layers, and the sacrificial dielectric layer 40 is one or more oxide layers. The opening 20 is formed in the dielectric layer 16 and the sacrificial dielectric layer 40 to thereby expose an area of the semiconductor structure 14, which is referred to herein as the exposed area 42 of the semiconductor structure 14.

Figure 6B:
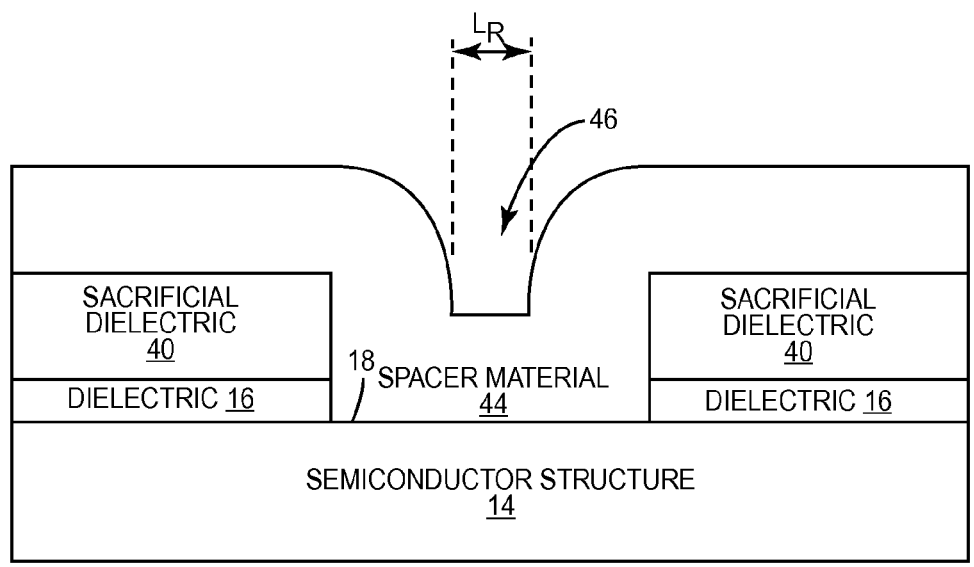

Next, the spacer material layer 44 is formed over the sacrificial dielectric layer 40 and on the exposed area 42 of the semiconductor structure 14 within the opening 20 in the dielectric layer 16 and the sacrificial dielectric layer 40, as illustrated in FIG. 6B. The spacer material layer 44 is preferably formed of a material that is either the same as the material used for the sacrificial dielectric layer 40 or is at least similar to the material used for the sacrificial dielectric layer 40. As a result of the opening 20 in the dielectric layer 16 and the sacrificial dielectric layer 40, the recess 46 naturally forms in the spacer material layer 44 over the exposed area of the semiconductor structure 14. As the thickness of the spacer material layer 44 increases, the length ($L_R$) of the recess 46 decreases. The length ($L_R$) of the recess 46 corresponds to the length ($L_P$) of the proximal end 24 of the gate contact 12 and thus the gate length ($L_G$) of the semiconductor device 10. As such, the spacer material layer 44 can be grown in such a manner as to achieve any desired gate length ($L_G$).

Figure 6C:
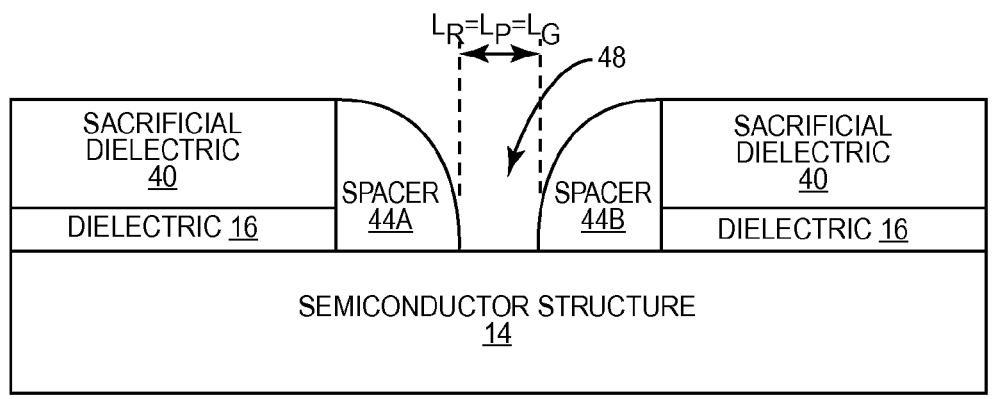

Next, the spacer material layer 44 is anisotropically etched in a direction that is perpendicular to the semiconductor structure 14 to form the spacers 44A and 44B that are adjacent to corresponding sidewalls of the dielectric layer 16 and the sacrificial dielectric layer 40, as illustrated in FIG. 6C. The anisotropic etch of the spacer material layer 44 exposes a portion of the semiconductor structure 14 within the opening 48 between the spacers 44A and 44B. The length of the opening 48 corresponds to the length ($L_R$) of the recess 46 in the spacer material layer 44 (FIG. 6B), which in turn corresponds to the length ($L_P$) of the proximal end 24 of the gate contact 12 and thus the gate length ($L_G$) of the semiconductor device 10.

Figure 6D:
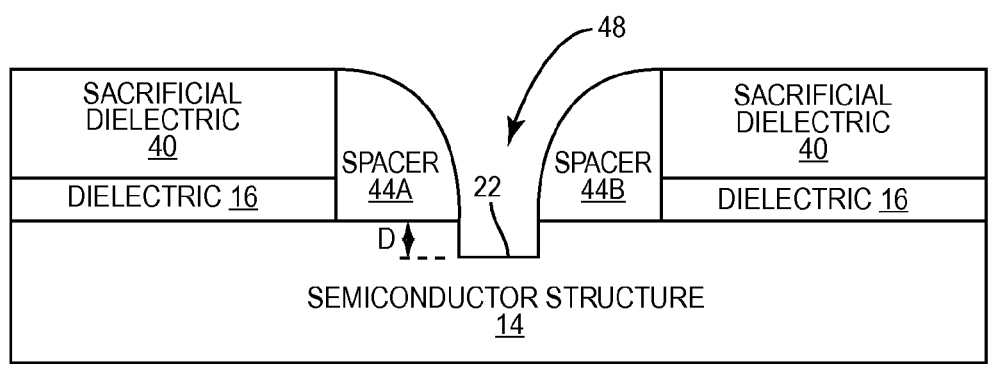
Figure 6E:
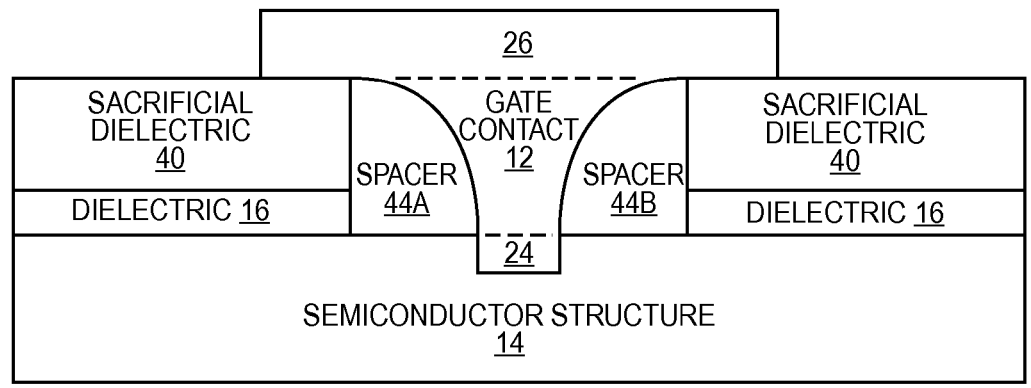

As illustrated in FIG. 6D, the semiconductor structure 14 is then etched to a desired depth (D) using the sacrificial dielectric layer 40 and the spacers 44A and 44B as a mask to thereby create the inner recess 22 that is aligned with the opening 48 between the spacers 44A and 44B. The inner recess 22 is referred to herein as a self-aligned recess in that, by using the spacers 44A and 44B as a mask, the inner recess 22 is naturally aligned over a desired portion of the semiconductor structure 14 for the gate contact 12 without the use of any additional alignment technique. Further, as a result of the spacers 44A and 44B, the inner recess 22 is laterally spaced apart from the sidewalls of the dielectric layer 16 and the sacrificial dielectric layer 40. In other words, the inner recess 22 is created within a portion of the exposed area 42 of the semiconductor structure 14 as defined by the spacers 44A and 44B. After forming the inner recess 22, the gate contact 12 is formed within the opening 48 between the spacers 44A and 44B and within the inner recess 22 as illustrated in FIG. 6E. As a result, the proximal end 24 of the gate contact 12 is formed on, and preferably directly on, the semiconductor structure 14 within the inner recess 22. The gate contact 12 fills the opening between the spacers 44A and 44B and, in this example, extends laterally over a portion of the sacrificial dielectric layer 40. As such, the gate contact 12 is a T-shaped structure.

Figure 6F:
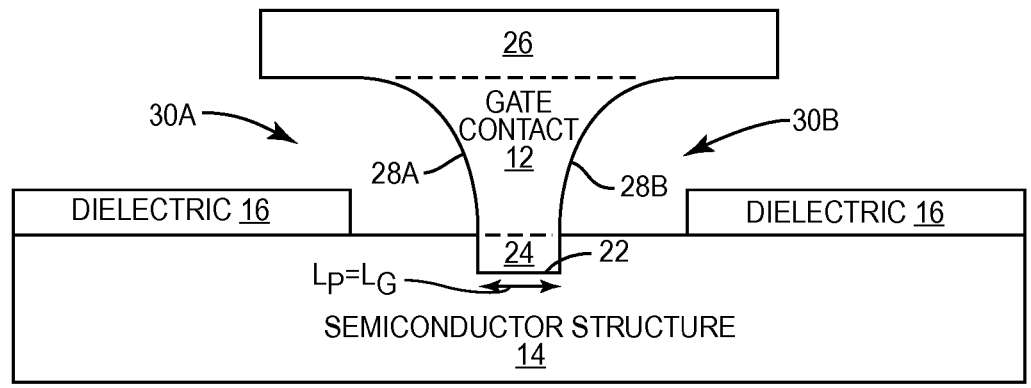
Figure 6G:
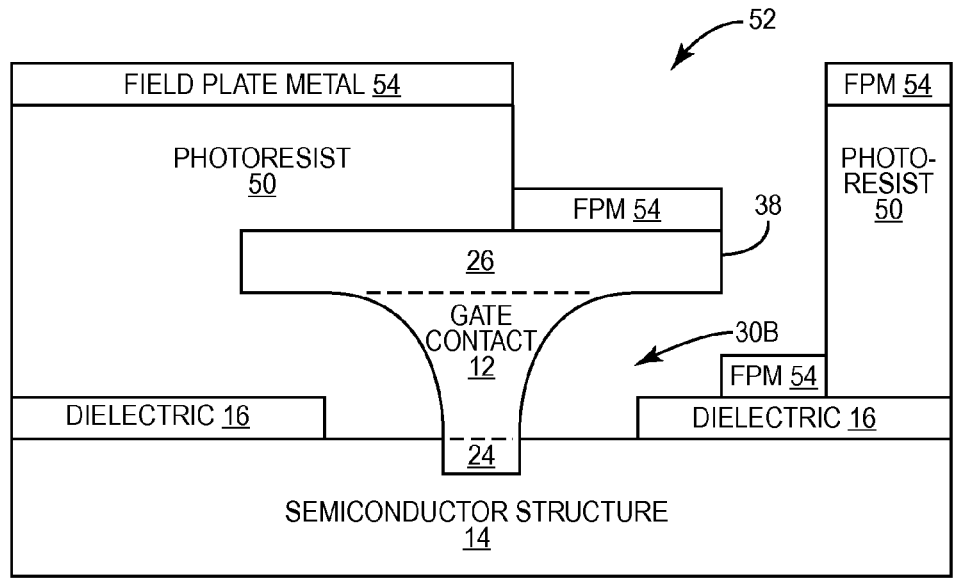
Figure 6H:
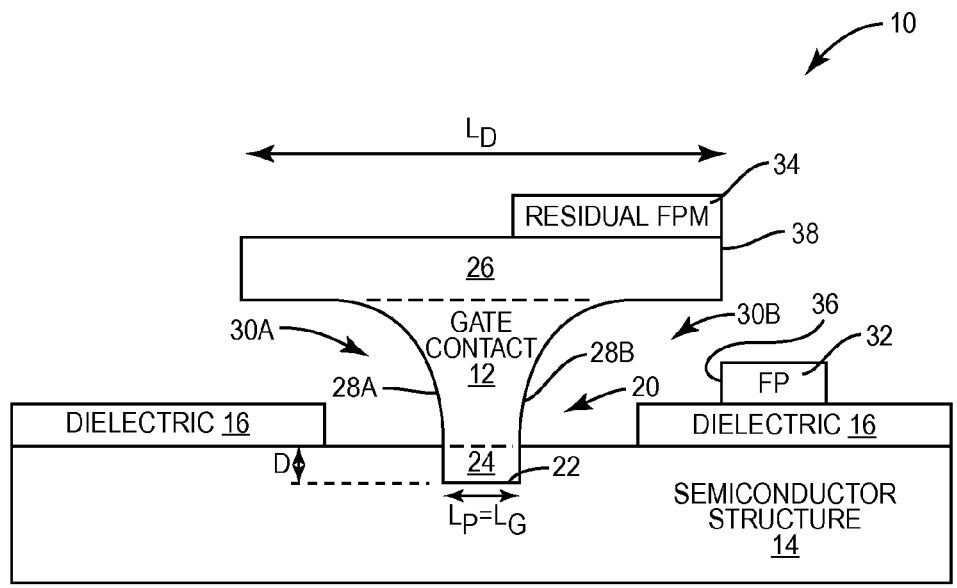

As illustrated in FIG. 6F, after the gate contact 12 is formed, the sacrificial dielectric layer 40 and the spacers 44A and 44B are removed using a selective etch to thereby form the air regions 30A and 30B. Since the sacrificial dielectric layer 40 and the spacers 44A and 44B are preferably formed of the same or similar dielectric material(s), a single etch may be used to remove both the sacrificial dielectric layer 40 and the spacers 44A and 44B. Next, as illustrated in FIG. 6G, the photoresist layer 50 is blanket deposited and patterned to form the opening 52. The field plate metal 54 is then deposited over the photoresist layer 50 and within the opening 52. Note that, as a result of the air region 30B, there is a natural break in the field plate metal 54 at the outer edge 38 of the distal end 26 of the gate contact 12. Lastly, the photoresist layer 50 is removed to provide the field plate 32 and the residual field plate metal 34 as illustrated in FIG. 6H.

Figure 7:
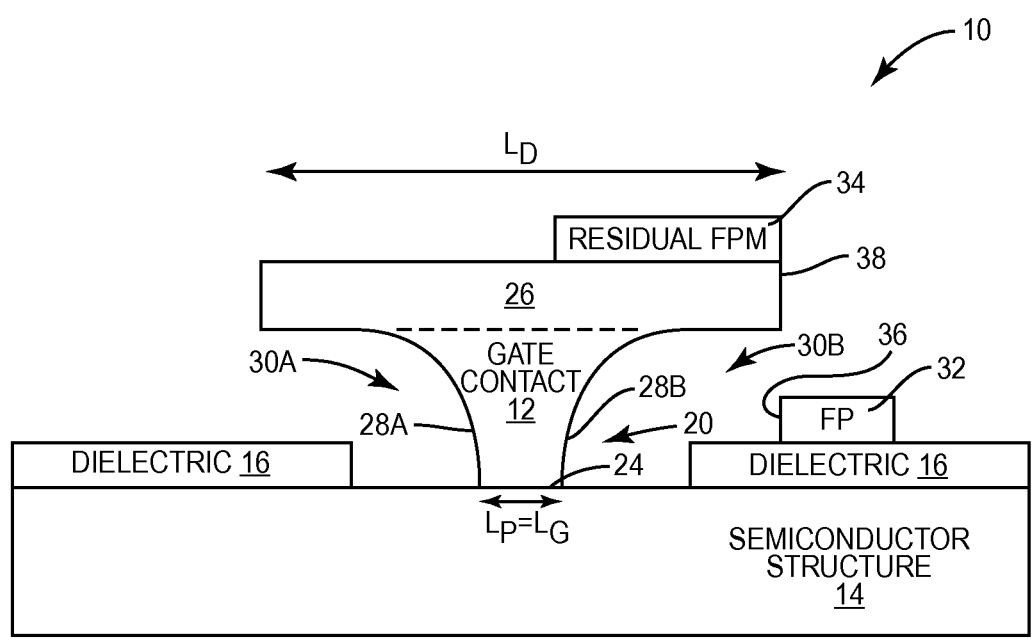
FIG. 7 illustrates a semiconductor device including a gate contact according to another embodiment of the present disclosure.

FIG. 7 illustrates the semiconductor device 10 according to another embodiment of the present disclosure. The semiconductor device 10 of FIG. 7 is substantially the same as that of FIG. 1. However, in this embodiment, there is no outer recess 18 and no inner recess 22. The proximal end 24 of the gate contact 12 is on, and preferably directly on, a portion of the semiconductor structure 14 within the opening 20 through the dielectric layer 16.

Figure 8A:
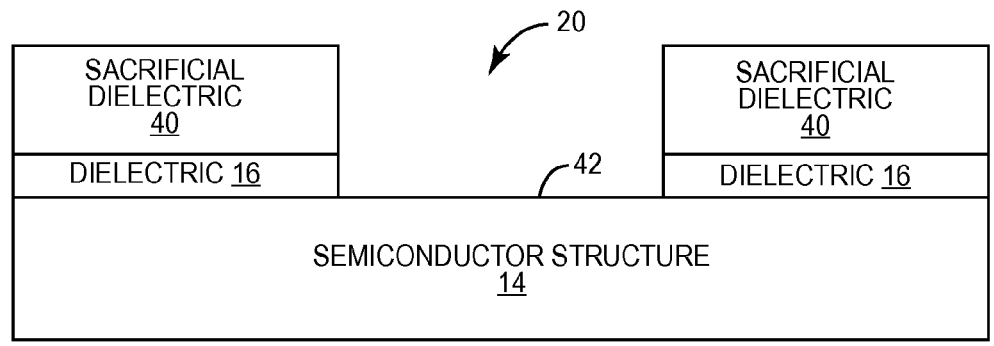
FIGS. 8A through 8G illustrate a process for fabricating the semiconductor device of FIG. 7 according to one embodiment of the present disclosure.

FIGS. 8A through 8G illustrate a method for fabricating the semiconductor device 10 of FIG. 7. This process is substantially the same as that of FIGS. 2A through 2I without the etching of the outer recess 18 illustrated in FIG. 2B or the etching of the inner recess 22 in FIG. 2E. First, as illustrated in FIG. 8A, the dielectric layer 16 is provided on the semiconductor structure 14, and the sacrificial dielectric layer 40 is formed on the dielectric layer 16 opposite the semiconductor structure 14. The dielectric layer 16 and the sacrificial dielectric layer 40 are formed such that they can be selectively etched. More specifically, in one embodiment, the dielectric layer 16 and the sacrificial dielectric layer 40 are formed of different dielectric materials that enable selective etching of the sacrificial dielectric layer 40. For example, in one particular embodiment, the dielectric layer 16 is one or more nitride layers, and the sacrificial dielectric layer 40 is one or more oxide layers. The opening 20 is formed in the dielectric layer 16 and the sacrificial dielectric layer 40 to thereby expose an area of the semiconductor structure 14, which is referred to herein as the exposed area 42 of the semiconductor structure 14.

Figure 8B:
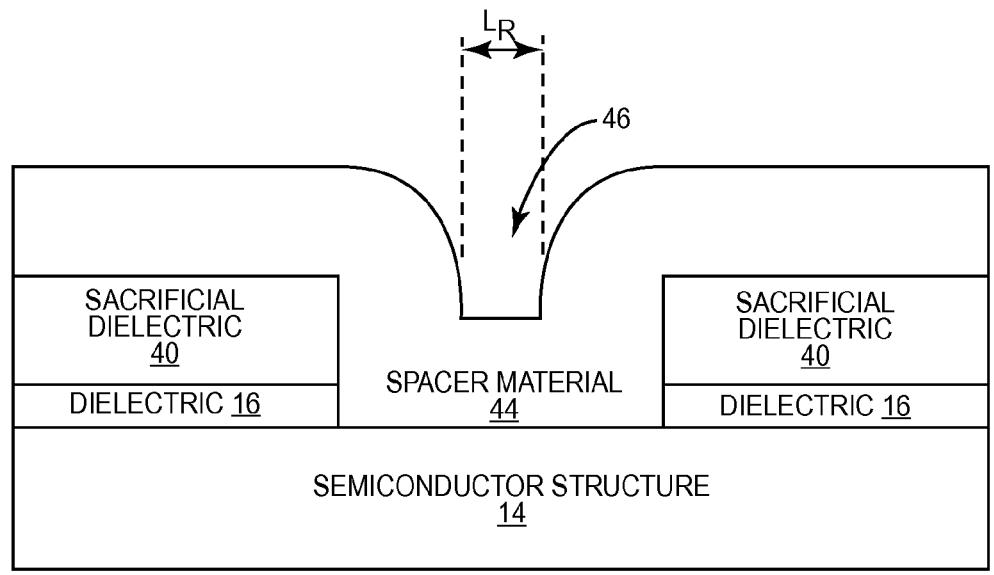

Next, the spacer material layer 44 is formed over the sacrificial dielectric layer 40 and on the exposed area 42 of the semiconductor structure 14 within the opening 20 in the dielectric layer 16 and the sacrificial dielectric layer 40, as illustrated in FIG. 8B. The spacer material layer 44 is preferably formed of a material that is either the same as the material used for the sacrificial dielectric layer 40 or is at least similar to the material used for the sacrificial dielectric layer 40. As a result of the opening 20 in the dielectric layer 16 and the sacrificial dielectric layer 40, the recess 46 naturally forms in the spacer material layer 44 over the exposed area of the semiconductor structure 14. As the thickness of the spacer material layer 44 increases, the length ($L_R$) of the recess 46 decreases. The length ($L_R$) of the recess 46 corresponds to the length ($L_P$) of the proximal end 24 of the gate contact 12 and thus the gate length ($L_G$) of the semiconductor device 10. As such, the spacer material layer 44 can be grown in such a manner as to achieve any desired gate length ($L_G$).

Figure 8C:
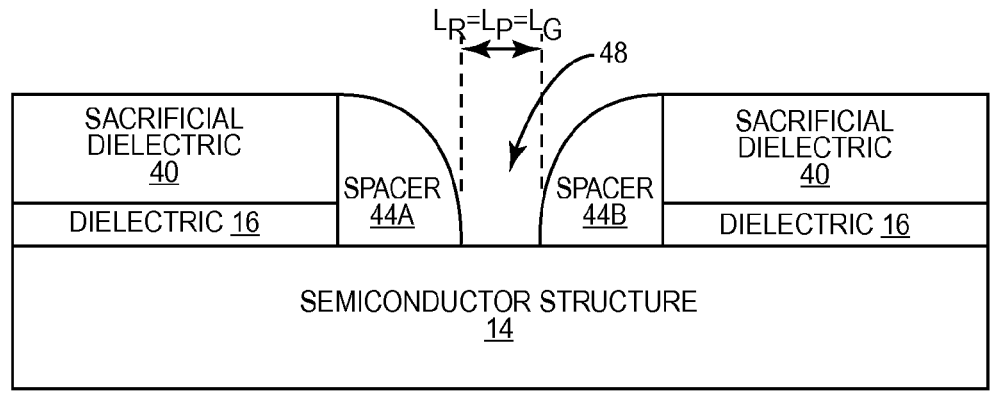

Next, the spacer material layer 44 is anisotropically etched in a direction that is perpendicular to the semiconductor structure 14 to form the spacers 44A and 44B that are adjacent to corresponding sidewalls of the dielectric layer 16 and the sacrificial dielectric layer 40, as illustrated in FIG. 8C. The anisotropic etch of the spacer material layer 44 exposes a portion of the semiconductor structure 14 within the opening 48 between the spacers 44A and 44B. The length of the opening 48 corresponds to the length ($L_R$) of the recess 46 in the spacer material layer 44 (FIG. 8B), which in turn corresponds to the length ($L_P$) of the proximal end 24 of the gate contact 12 and thus the gate length ($L_G$) of the semiconductor device 10.

Figure 8D:
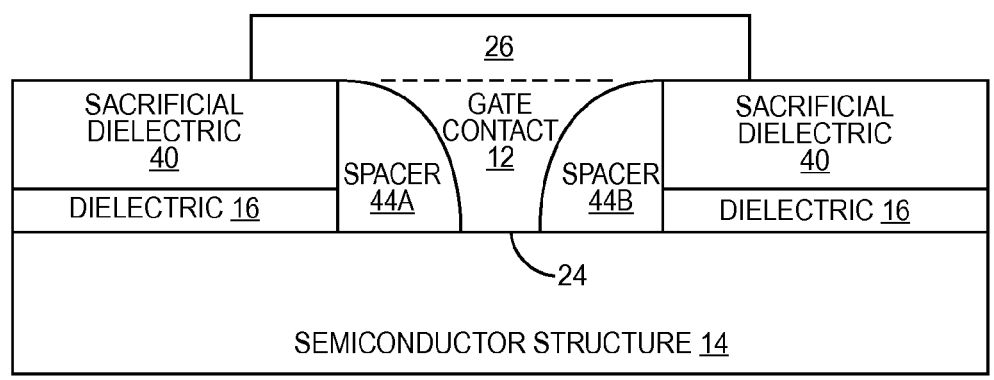

As illustrated in FIG. 8D, the gate contact 12 is formed on, and preferably directly on, the portion of the semiconductor structure 14 exposed by the opening 48 between the spacers 44A and 44B as illustrated in FIG. 8D. As a result, the proximal end 24 of the gate contact 12 is formed on, and preferably directly on, the portion of the semiconductor structure 14 exposed between the spacers 44A and 44B. The gate contact 12 fills the opening between the spacers 44A and 44B and, in this example, extends laterally over a portion of the sacrificial dielectric layer 40. As such, the gate contact 12 is a T-shaped structure.

Figure 8E:
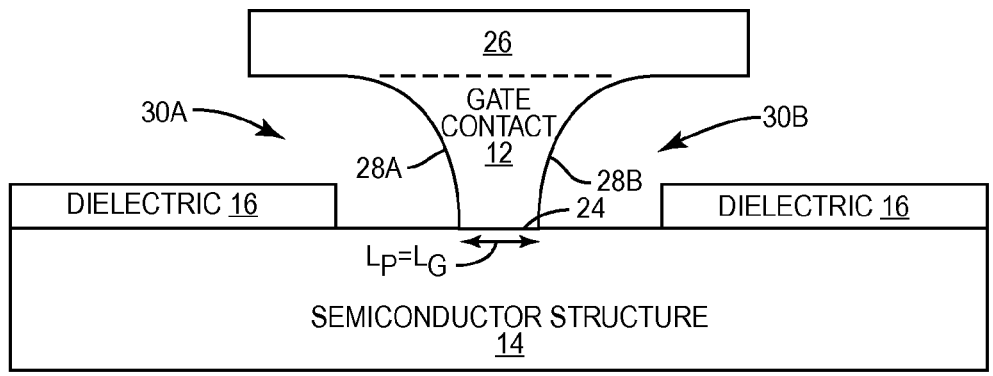
Figure 8F:
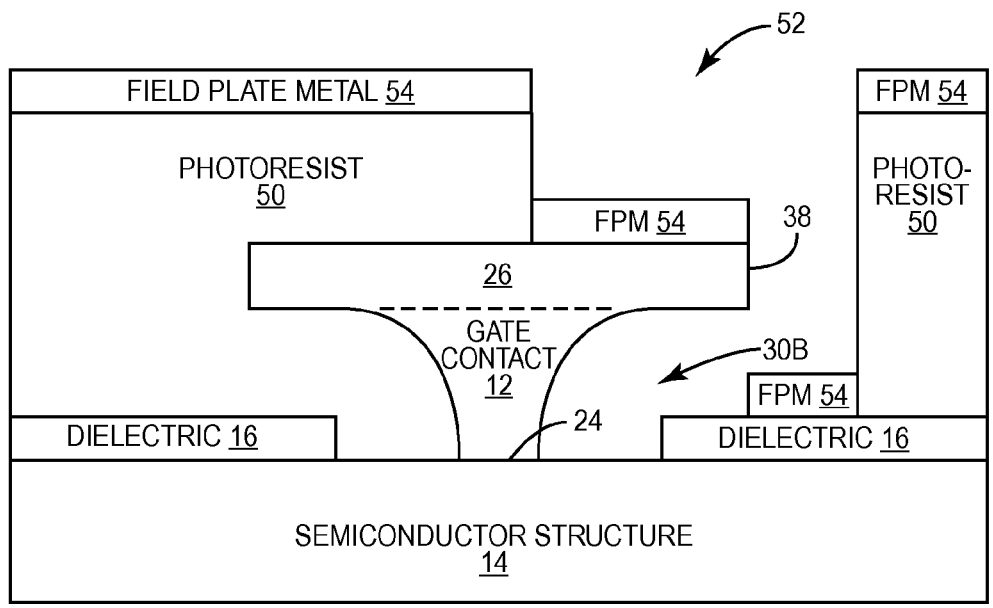
Figure 8G:
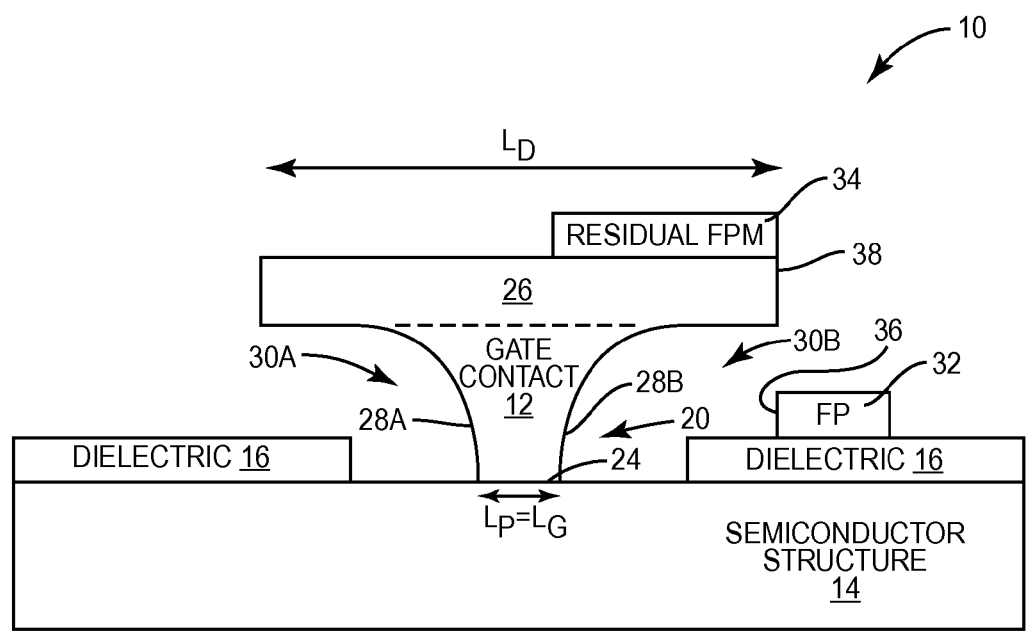

As illustrated in FIG. 8E, after the gate contact 12 is formed, the sacrificial dielectric layer 40 and the spacers 44A and 44B are removed using a selective etch to thereby form the air regions 30A and 30B. Next, as illustrated in FIG. 8F, the photoresist layer 50 is blanket deposited and patterned to form the opening 52. The field plate metal 54 is then deposited over the photoresist layer 50 and within the opening 52. Note that, as a result of the air region 30B, there is a natural break in the field plate metal 54 at the outer edge 38 of the distal end 26 of the gate contact 12. Lastly, the photoresist layer 50 is removed to provide the field plate 32 and the residual field plate metal 34 as illustrated in FIG. 8G.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
   semiconductor structure;
   a dielectric layer on a surface of the semiconductor structure, the dielectric layer having an opening that exposes an area of the semiconductor structure to thereby provide an exposed area of the semiconductor structure;
   a gate contact comprising:
      a proximal end on a portion of the exposed area of the semiconductor structure;
      a distal end opposite the proximal end; and
      sidewalls that each extends between the proximal end and the distal end;
   a field plate on a surface of the dielectric layer adjacent to the gate contact; and
   for each of the sidewalls of the gate contact, an air region that separates the sidewall of the gate contact from the dielectric layer;
   wherein the field plate has a first edge that is aligned with an edge of the distal end of the gate contact and extends laterally away from the gate contact to a second edge of the field plate, and the field plate is separated from an adjacent one of the sidewalls of the gate contact and the distal end of the gate contact by the air region that separates the adjacent one of the sidewalls of the gate contact and the distal end of the gate contact from the dielectric layer.

2. The semiconductor device of claim 1 wherein the proximal end of the gate contact is directly on the portion of the exposed area of the semiconductor structure.

3. The semiconductor device of claim 2 wherein a length of the proximal end of the gate contact is less than a length of the distal end of the gate contact.

4. The semiconductor device of claim 2 wherein a length of the proximal end of the gate contact is a gate length of the semiconductor device and is less than or equal to 0.15 micrometers.

5. The semiconductor device of claim 2 wherein a length of the proximal end of the gate contact is a gate length of the semiconductor device and is in a range of and including 0.05 to 0.25 micrometers.

6. The semiconductor device of claim 2 wherein a length of the proximal end of the gate contact is a gate length of the semiconductor device and is in a range of and including 0.05 to 0.15 micrometers.

7. The semiconductor device of claim 2 wherein a length of the proximal end of the gate contact is a gate length of the semiconductor device and is in a range of and including 0.05 to 0.1 micrometers.

8. The semiconductor device of claim 1 wherein:
   the semiconductor structure comprises a recess that is aligned with the opening in the dielectric layer and extends from the surface of the semiconductor structure to a desired depth in the semiconductor structure; and
   the proximal end of the gate contact is directly on a portion of the semiconductor structure within the recess.

9. The semiconductor device of claim 8 wherein, for each sidewall of the sidewalls of the gate contact, the air region that separates the sidewall and the distal end of the gate contact from the dielectric layer also separates the sidewall of the gate contact from a sidewall of the recess.

10. The semiconductor device of claim 1 wherein:
the semiconductor structure comprises a recess that is in a portion of the exposed area of the semiconductor structure and extends from the surface of the semiconductor structure to a desired depth in the semiconductor structure; and
the proximal end of the gate contact is aligned with and is within the recess in the semiconductor structure such that the proximal end of the gate contact is directly on a portion of the semiconductor structure within the recess.

11. A semiconductor device comprising:
semiconductor structure and a dielectric layer on a surface of the semiconductor structure, wherein:
the dielectric layer having an opening that exposes an area of the semiconductor structure to thereby provide an exposed area of the semiconductor structure; and
the semiconductor structure comprises:
an outer recess that is aligned with the opening in the dielectric layer and extends from the surface of the semiconductor structure to a first depth in the semiconductor structure; and
an inner recess that is within the outer recess and extends from a bottom of the outer recess to a second depth in the semiconductor structure;
a gate contact comprising:
a proximal end on a portion of the exposed area of the semiconductor structure, the proximal end being aligned with and within the inner recess in the semiconductor structure such that the proximal end of the gate contact is directly on a portion of the semiconductor structure within the inner recess;
a distal end opposite the proximal end; and
sidewalls that each extend between the proximal end and the distal end; and
for each of the sidewalls of the gate contact, an air region that separates the sidewall of the gate contact from the dielectric layer.

12. The semiconductor device of claim 11 wherein, for each sidewall of the sidewalls of the gate contact, the air region that separates the sidewall and the distal end of the gate contact from the dielectric layer also separates the sidewall of the gate contact from a sidewall of the outer recess.

13. The semiconductor device of claim 11 wherein, for each of the sidewalls of the gate contact, the air region further separates the distal end of the gate contact from the dielectric layer.

14. The semiconductor device of claim 11 wherein a length of the proximal end of the gate contact is less than a length of the distal end of the gate contact.

15. The semiconductor device of claim 11 wherein a length of the proximal end of the gate contact is a gate length of the semiconductor device and is less than or equal to 0.15 micrometers.

16. The semiconductor device of claim 11 wherein a length of the proximal end of the gate contact is a gate length of the semiconductor device and is in a range of and including 0.05 to 0.25 micrometers.

17. The semiconductor device of claim 11 wherein a length of the proximal end of the gate contact is a gate length of the semiconductor device and is in a range of and including 0.05 to 0.15 micrometers.

18. The semiconductor device of claim 11 wherein a length of the proximal end of the gate contact is a gate length of the semiconductor device and is in a range of and including 0.05 to 0.1 micrometers.

19. The semiconductor device of claim 11 further comprising a field plate on a surface of the dielectric layer adjacent to the gate contact.

20. The semiconductor device of claim 19 wherein the field plate has a first edge that is aligned with an edge of the distal end of the gate contact and extends laterally away from the gate contact to a second edge of the field plate;
wherein the field plate is separated from an adjacent one of the sidewalls of the gate contact and the distal end of the gate contact by the air region that separates the adjacent one of the sidewalls of the gate contact and the distal end of the gate contact from the dielectric layer.

21. A semiconductor device comprising:
semiconductor structure;
a dielectric layer on a surface of the semiconductor structure, the dielectric layer having an opening that exposes an area of the semiconductor structure to thereby provide an exposed area of the semiconductor structure;
a gate contact comprising:
a proximal end on the exposed area of the semiconductor structure;
a distal end opposite the proximal end; and
sidewalls that each extend between the proximal end and the distal end;
an air region that separates the distal end of the gate contact from the dielectric layer; and
a field plate on a surface of the dielectric layer adjacent to the gate contact with a first edge that is aligned with an edge of the distal end of the gate contact and is separated from an adjacent one of the sidewalls of the gate contact and the distal end of the gate contact by the air region.

22. The semiconductor device of claim 21 wherein the proximal end of the gate contact is directly on the exposed area of the semiconductor structure.

23. The semiconductor device of claim 22 wherein a length of the proximal end of the gate contact is less than a length of the distal end of the gate contact.

24. The semiconductor device of claim 22 wherein a length of the proximal end of the gate contact is a gate length of the semiconductor device and is less than or equal to 0.15 micrometers.

25. The semiconductor device of claim 22 wherein a length of the proximal end of the gate contact is a gate length of the semiconductor device and is in a range of and including 0.05 to 0.25 micrometers.

26. The semiconductor device of claim 22 wherein a length of the proximal end of the gate contact is a gate length of the semiconductor device and is in a range of and including 0.05 to 0.15 micrometers.

27. The semiconductor device of claim 22 wherein a length of the proximal end of the gate contact is a gate length of the semiconductor device and is in a range of and including 0.05 to 0.1 micrometers.

* * * * *